United States Patent
Kumar

(10) Patent No.: US 7,945,218 B1
(45) Date of Patent: *May 17, 2011

(54) METHOD AND SYSTEM FOR TUNING QUALITY FACTOR IN HIGH-Q, HIGH-FREQUENCY FILTERS

(75) Inventor: Ajay Kumar, Fort Collins, CO (US)

(73) Assignee: National Semiconductor Corporation, Santa Clara, CA (US)

(*) Notice: Subject to any disclaimer, the term of this patent is extended or adjusted under 35 U.S.C. 154(b) by 1293 days.

This patent is subject to a terminal disclaimer.

(21) Appl. No.: 11/515,216

(22) Filed: Sep. 1, 2006

Related U.S. Application Data

(63) Continuation of application No. 10/686,101, filed on Oct. 15, 2003, now Pat. No. 7,103,334.

(51) Int. Cl.
*H04B 1/40* (2006.01)
*H04K 3/00* (2006.01)

(52) U.S. Cl. .......................... 455/77; 455/120

(58) Field of Classification Search .............. 455/76–77, 455/87, 120, 125, 173.1, 180.1, 182.1, 183.1, 455/213, 260; 375/308, 376; 327/147
See application file for complete search history.

(56) References Cited

U.S. PATENT DOCUMENTS

| | | | |
|---|---|---|---|
| 4,355,414 A | 10/1982 | Inoue | |
| 5,576,976 A * | 11/1996 | White | 702/190 |
| 5,945,889 A | 8/1999 | Shanthi-Pavan et al. | |
| 6,091,303 A | 7/2000 | Dent | |
| 6,285,865 B1 | 9/2001 | Vorenkamp et al. | |
| 6,377,315 B1 | 4/2002 | Carr et al. | |
| 6,490,441 B1 | 12/2002 | Saito | |
| 6,549,766 B2 | 4/2003 | Vorenkamp et al. | |
| 6,931,243 B2 | 8/2005 | Goldman | |
| 7,103,334 B1 * | 9/2006 | Kumar | 455/213 |
| 2003/0119466 A1 | 6/2003 | Goldman | |

OTHER PUBLICATIONS

H. Elhallabi et al., "High Frequency CMOS GM-C Bandpass Filter with Automatic On-Chip Tuning", PolySTIM Neurotechnology Laboratory, Department of Electrical and Computer Engineering, 2001 IEEE, pp. 823-826.

Aydin Iker Karsilayan, "A Novel Automatic Tuning Scheme for High-Frequency High-Q Continuous-Time Filters", Texas A&M University, Department of Electrical Engineering, 2001 IEEE, pp. 126-130.

Hengsheng Liu et al., "A High Frequency Bandpass Continuous-Time Filter with Automatic Frequency and Q-Factor Tuning", Texas A&M University, Department of Electrical Engineering, 2001 IEEE, pp. I-328-I-331.

Juan Ignacio Osa et al., "MOSFET-C Filter with On-Chip Tuning and Wide Programming Range", IEEE Transactions on Circuits and Systems-II: Analog and Digital Signal Processing, vol. 48, No. 10, Oct. 2001, pp. 944-951.

Hiroshi Yamazaki et al., "An Accurate Center Frequency Tuning Scheme for 450-kHz CMOS Gm-C Bandpass Filters", IEEE Journal of Solid-State Circuits, vol. 34, No. 12, Dec. 1999, pp. 1691-1697.

(Continued)

*Primary Examiner* — Lee Nguyen

(57) ABSTRACT

A method for tuning quality factor (Q) in a high-Q, high-frequency filter is provided that includes filtering an input signal to generate a filtered signal. The input signal comprises a specified frequency. The filtered signal comprises an actual phase shift with respect to the input signal. The actual phase shift is compared to a desired phase shift for the filtered signal to determine a difference between the actual phase shift and the desired phase shift. The desired phase shift corresponds to the specified frequency. The filter is tuned based on the difference between the actual phase shift and the desired phase shift.

20 Claims, 3 Drawing Sheets

OTHER PUBLICATIONS

Teemu Salo et al., "Direct Digital Tuning for Continuous-Time Filters", Proc. 43rd IEEE Midwest Symp. on Circuits and Systems, Aug. 8-11, 2000, pp. 216-219.

Jose Silva-Martinez et al., "A 10.7-MHz 68-dB SNR CMOS Continuous-Time Filter with On-Chip Automatic Tuning", IEEE Journal of Solid-State Circuits, vol. 27, No. 12, Dec. 1992, pp. 1843-1853.

* cited by examiner ns of certain words and phrases used throughout this
METHOD AND SYSTEM FOR TUNING QUALITY FACTOR IN HIGH-Q, HIGH-FREQUENCY FILTERS This application is a continuation of prior U.S. patent application Ser. No. 10/686,101 filed on Oct. 15, 2003 now U.S. Pat. No. 7,103,334.

TECHNICAL FIELD OF THE INVENTION

The present invention relates generally to filters in communication systems and, more particularly, to a method and system for tuning quality factor (Q) in high-Q, high-frequency filters.

BACKGROUND OF THE INVENTION

Present trends towards smaller and cheaper wireless communication devices have resulted in the development of on-chip replacements for bulky intermediate frequency (IF) surface acoustic wave (SAW) filters, which had been widely used in the past. However, unlike SAW filters, on-chip filters cannot be fabricated precisely because of the inherent random variations in the fabrication process for integrated circuits. Because of this, on-chip filters generally have a tuning mechanism that tunes their center frequencies and quality factors to assure their performance over all operating conditions.

The quality factor (Q) is inversely proportional to the bandwidth of the filter. Thus, if Q is more than the desired value, the bandwidth is less than the desired bandwidth. In this situation, the filter does not select the whole bandwidth and the system loses information. Similarly, if Q is less than the desired value, the bandwidth is too large. In this situation, the filter picks up noise along with the signals, making signal processing difficult. Therefore, the Q value of the filter needs to be accurately tuned in order to obtain optimal performance from the communication system.

Conventional methods for tuning Q include magnitude locked loops and envelope detection. Magnitude locked loops use the fact that the midband gain of the filter is proportional to Q. This method tunes Q indirectly by tuning the filter's gain. In doing this, the method employs a magnitude locked loop around the filter and compares the filter output signal strength with a reference amplifier output, tuning the filter gain with a resulting error signal. However, the frequency of operation is limited by the reference amplifier gain-bandwidth, and a reference amplifier with a gain proportional to Q at the filter center frequency is required. Thus, although this method works well for relatively low-Q, low-frequency bandpass filters, it fails to provide accurate Q tuning for filters with a Q value of about 100 or higher and with center frequencies of about 10 MHz or higher.

The envelope detection method tunes Q indirectly by adjusting the filter's transient characteristics associated with the filter step response. In doing this, the method compares the filter output transient envelope with a reference envelope, tuning the filter output envelope with a resulting error signal. Tuning the filter output envelope in this manner tunes the filter transient time constant, which is proportional to Q. However, the frequency of operation is limited by the center frequency signal component in the step function, and the envelope detection method requires a very fast peak detector for high frequencies. Thus, although this method works well for relatively low-Q, low-frequency bandpass filters, it fails to provide accurate Q tuning for filters with a Q value of about 100 or higher and with center frequencies of a few MHz or higher.

Before undertaking the DETAILED DESCRIPTION OF THE INVENTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged integrated circuit.

Figure 1:
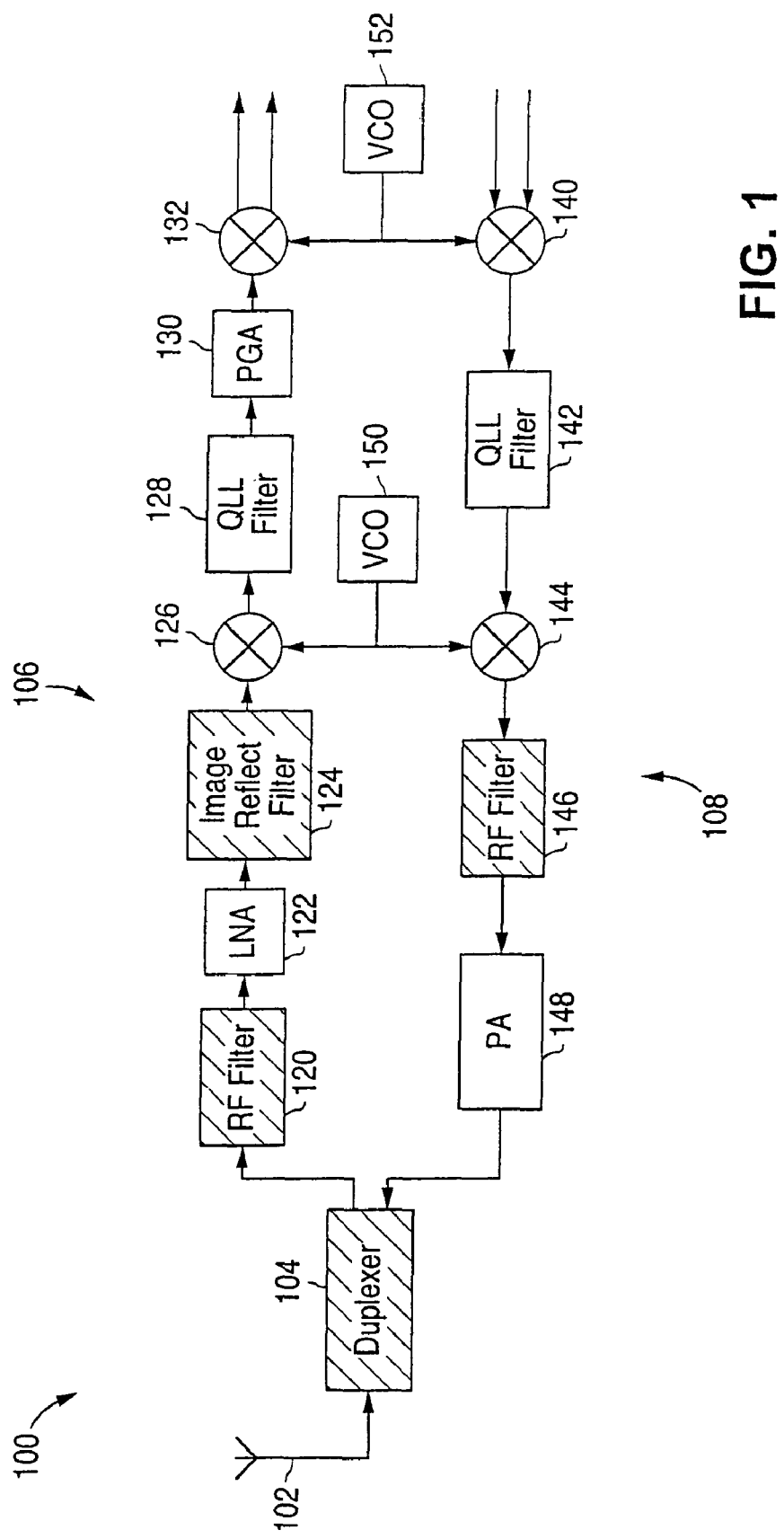
FIG. 1 is a block diagram illustrating a transceiver incorporating a system for tuning quality factor (Q) in high-Q, high-frequency filters in accordance with one embodiment of the present invention.

FIG. 1 is a block diagram illustrating a transceiver 100 incorporating a system for tuning quality factor (Q) in high-Q, high-frequency filters in accordance with one embodiment of the present invention. The transceiver 100, which may be an implementation of a heterodyne wireless transceiver, comprises an antenna 102, a duplexer 104, receiver circuitry 106 and transmitter circuitry 108. The antenna 102 is coupled to the duplexer 104 and is operable to transmit signals to and receive signals from the duplexer 104. The duplexer 104 is coupled to the receiver circuitry 106 and the transmitter circuitry 108. The duplexer 104 is operable to transmit signals received from the antenna to the receiver circuitry 106 and to transmit signals received from the transmitter circuitry 108 to the antenna 102.

The receiver circuitry 106 comprises a radio frequency (RF) filter 120, a low-noise amplifier (LNA) 122, an image reject filter 124, a first receiver mixer 126, a Q locked loop (QLL) filter 128, a programmable gain amplifier (PGA) 130 and a second receiver mixer 132. The transmitter circuitry 108 comprises a first transmitter mixer 140, a Q locked loop filter 142, a second transmitter mixer 144, a radio frequency filter 146 and a power amplifier (PA) 148.

The transceiver 100 also comprises first and second voltage-controlled oscillators (VCOs) 150 and 152 that are both coupled to the receiver circuitry 106 and the transmitter circuitry 108. The first voltage-controlled oscillator 150 is coupled to the first receiver mixer 126 and the second transmitter mixer 144, while the second voltage-controlled oscillator 152 is coupled to the second receiver mixer 132 and the first transmitter mixer 140.

According to one embodiment, the low-noise amplifier 122, the mixers 126, 132, 140 and 144, the QLL filters 128 and 142, the programmable gain amplifier 130, the power amplifier 148 and the voltage-controlled oscillators 150 and 152 are implemented together in an integrated circuit. It will be understood that the integrated circuit may comprise additional components not shown in FIG. 1 without departing from the scope of the present invention.

In operation, for a received signal, the RF filter 120 selects the signal band from the received signal. The first receiver mixer 126 then converts the RF signal to an intermediate frequency (IF) signal. The QLL filter 128 selects the desired channel from the signal band, and the second receiver mixer 132 extracts the baseband signal from the IF signal. The transmitter circuitry 108 operates similarly to transmit baseband signals as RF signals.

The QLL filters 128 and 142 are high-Q, high-frequency filters and each comprises a system for tuning Q by locking a filter output phase change to a known reference value at a known reference frequency, as described in more detail below in connection with FIGS. 2-4. As used herein, "each" means every one of at least a subset of the identified items. According to one embodiment of the present invention, the Q value of each of the filters 128 and 142 may be tuned to within 1% of a desired Q value.

According to one embodiment, "high Q" means a Q value of at least 50 and "high frequency" means the center frequencies of these filters 128 and 142 are at least 10 MHz. According to another embodiment, "high Q" means a Q value of at least 350 and "high frequency" means the center frequencies of these filters 128 and 142 are at least 70 MHz. According to yet another embodiment, "high Q" means a Q value of at least 50 and "high frequency" means the center frequencies of these filters 128 and 142 are at least 300 MH However, it will be understood that the Q values and the center frequencies may comprise any suitable values without departing from the scope of the present invention.

The QLL filters 128 and 142 may comprise a master-slave tuning strategy or a direct tuning strategy. For the master-slave tuning strategy, two circuits are used: a master circuit and a slave circuit. The master circuit is a replica of the slave circuit. For this strategy, the slave circuit, which is the filter that is actually used by the system, is tuned using information extracted from the master circuit. This strategy may be used to tune a filter while the filter is operating. For the direct tuning strategy, the information used to tune the filter is extracted from the filter itself. Thus, this strategy may be more accurate than the master-slave approach; however, the filter has to be disconnected from the application during tuning. Therefore, if the application needs high accuracy and permits the filter to be disconnected, the direct tuning strategy may be used. However, if the application does not permit the filter to be disconnected, the master-slave strategy is used, with the complexity of the master, circuit determined by the accuracy requirements of the application.

Figure 2:
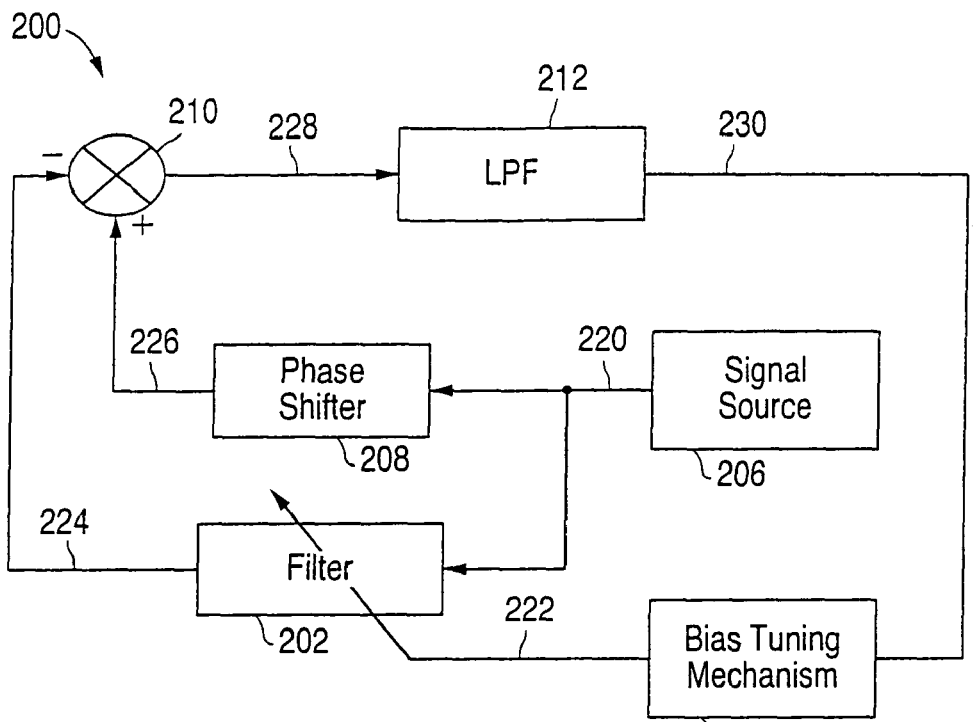
FIG. 2 is a block diagram illustrating the Q locked loop filter of FIG. 1 in accordance with one embodiment of the present invention.

FIG. 2 is a block diagram illustrating a QLL filter 200 in accordance with one embodiment of the present invention. The QLL filter 200 may be used as the QLL filter 128 and/or the QLL filter 142 in the transceiver 100. However, it will be understood that the QLL filter 200 may be incorporated into any suitable integrated circuit application without departing from the scope of the present invention.

The QLL filter 200 comprises a filter 202, a bias tuning mechanism 204, a signal source 206, a phase shifter 208, a mixer/phase frequency detector (PFD) 210 and a low-pass filter (LPF) 212. The filter 202 is coupled to the signal source 206 and to the mixer/PFD 210, in addition to the bias tuning mechanism 204. The phase shifter 208 is also coupled to the signal source 206 and to the mixer/PFD 210. The mixer/PFD 210 is coupled to the low-pass filter 212, and the low-pass filter 212 is coupled to the bias tuning mechanism 204.

The signal source 206 is operable to generate an input signal 220 for the filter 202 and the phase shifter 208. The input signal 220 may comprise a reference frequency signal other than the center frequency. For example, for the embodiment in which the filter 202 comprises a biquad filter, the reference frequency signal may comprise a 3 dB frequency for the filter 202.

The bias tuning mechanism 204 is operable to generate a tuning signal 222 to tune the filter 202. The filter 202 is operable to receive the tuning signal 222 from the bias tuning mechanism 204. The filter 202 is also operable to filter the input signal 220 received from the signal source 206 based on the tuning signal 222 to generate a filtered signal 224.

The phase shifter 208 is operable to shift the phase of the input signal 220 received from the signal source 206 to generate a shifted signal 226. The mixer/PFD 210 is operable to receive the filtered signal 224 and the shifted signal 226, to compare the phases of the two signals 224 and 226, and to generate an error signal 228 based on the difference between the phases of the two signals 224 and 226. Because any delay in the system effectively results in a phase change for delayed signals, the delays through the filter 202 and the phase shifter 208 are designed to be either equal or multiples of $2\pi$ in order to prevent any offset error in Q.

The low-pass filter 212 is operable to receive the error signal 228 and to filter the error signal 228 to generate a filtered error signal 230. According to one embodiment, the low-pass filter 212 may comprise a charge pump circuit. However, it will be understood that any other suitable implementation of the low-pass filter 212 may be used without departing from the scope of the present invention.

The bias tuning mechanism 204 is operable to receive the filtered error signal 230 from the low-pass filter 212 and to generate the tuning signal 222 based on the filtered error signal 230. Thus, the bias tuning mechanism 204 is operable to tune the filter 202 by adjusting the tuning signal 222 in response to any difference between the phase of the filtered signal 224 and the phase of the shifted signal 226. When there is no longer any difference between the phases of the two signals 224 and 226, the filter 202 is tuned.

For one embodiment, as an example, the filter 202 may comprise a biquad filter, which should provide a 45° phase shift at its 3 dB frequencies. In this example, the filter 202 may be assumed to be tuned to its center frequency. For tuning, the signal source 206 may generate one of the filter's 3 dB frequencies as the input signal 220, and the phase shifter 208 may shift the phase of the input signal 220 by 45° to generate the shifted signal 226. The tuning signal 222 is then adjusted by the bias tuning mechanism 204 until the filter 202 generates the filtered signal 224 with a 45° phase shift with respect to the input signal 220. However, it will be understood that the input signal 220 may comprise any suitable, known reference frequency and the phase shifter 208 may shift the phase of that input signal 220 by a corresponding known reference value without departing from the scope of the present invention.

Figure 3:
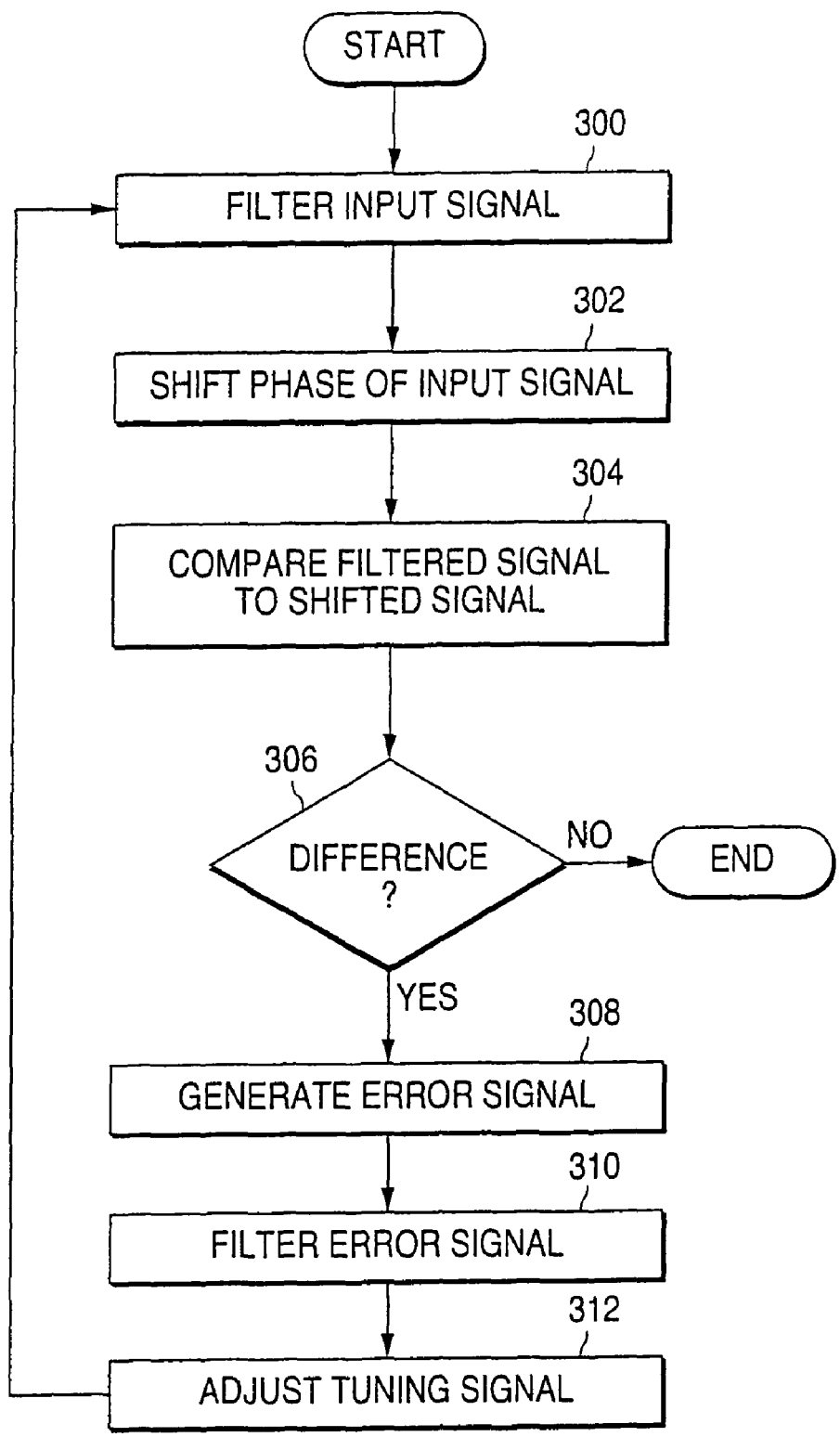
FIG. 3 is a flow diagram illustrating a method for tuning quality factor in the Q locked loop filter of FIG. 2 in accordance with one embodiment of the present invention.

FIG. 3 is a flow diagram illustrating a method for tuning quality factor in the QLL filter 200 in accordance with one embodiment of the present invention. The method begins at step 300 where the filter 202 filters the input signal 220 received from the signal source 206 to generate a filtered signal 224. The filter 202 generates the filtered signal 224 based on a tuning signal 222 received from the bias tuning mechanism 204.

At step 302, the phase shifter 208 shifts the phase of the input signal 220 received from the signal source 206 to generate a shifted signal 226. At step 304, the mixer/PFD 210 compares the phase of the filtered signal 224 to the phase of the shifted signal 226. At decisional step 306, a determination is made regarding whether or not there is a difference between the phases of the filtered signal 224 and the shifted signal 226. If there is a difference between the phases of the signals 224 and 226, the method follows the Yes branch from decisional step 306 to step 308.

At step 308, the mixer/PFD 210 generates an error signal 228 based on the difference between the phases of the filtered signal 224 and the shifted signal 226. At step 310, the low-pass filter 212 filters the error signal 228 to generate a filtered error signal 230. At step 312, the bias tuning mechanism 204 adjusts the tuning signal 222 based on the filtered error signal 230 in order to reduce the difference between the phases of the filtered signal 224 and the shifted signal 226. At this point, the method returns to step 300 where the filter 202 filters the input signal 220 based on the adjusted tuning signal 222.

Returning to decisional step 306, if there is no difference between the phase of the filtered signal 224 and the phase of the shifted signal 226, the filter 202 is tuned and the method follows the No branch from decisional step 306 and comes to an end.

Figure 4:
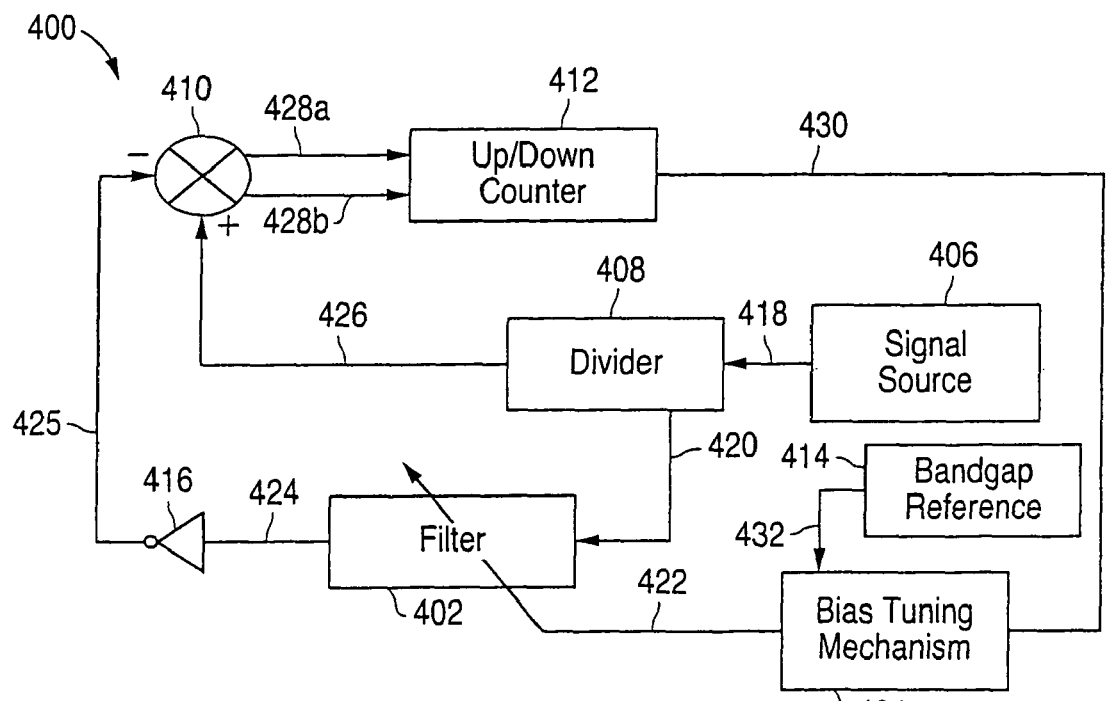
FIG. 4 is a block diagram illustrating the Q locked loop filter of FIG. 1 in accordance with another embodiment of the present invention.

FIG. 4 is a block diagram illustrating a QLL filter 400 in accordance with one embodiment of the present invention. The QLL filter 400, which is one possible implementation of the QLL filter 200 described above in connection with FIGS. 2 and 3, may be used as the QLL filter 128 and/or the QLL filter 142 in the transceiver 100. However, it will be understood that the QLL filter 400 may be incorporated into any suitable integrated circuit application without departing from the scope of the present invention.

The QLL filter 400 comprises a filter 402, a bias tuning mechanism 404, a signal source 406, a divider 408, a digital phase frequency detector (DPFD) 410, an up/down counter 412, a bandgap reference 414 and an inverter set 416. The filter 402 is coupled to the signal source 406 and to the DPFD 410 through the inverter set 416, in addition to the bias tuning mechanism 404. The divider 408 is also coupled to the signal source 406 and to the DPFD 410. The DPFD 410 is coupled to the up/down counter 412, and the up/down counter 412 is coupled to the bias tuning mechanism 404. The bandgap reference 414 is coupled to the bias tuning mechanism 404.

The signal source 406 is operable to generate a reference signal 418 for the divider 408. The reference signal 418 may comprise a fixed multiple of the reference frequency signal.

According to one embodiment, the fixed multiple is eight. Thus, for this embodiment, the frequency of the reference signal 418 is eight times greater than the frequency of the reference frequency signal that is to be filtered by the filter 402. The divider 408 is operable to divide the frequency of the reference signal 418 by the fixed multiple to generate an input signal 420 for the filter 402. Thus, the input signal 420 comprises the reference frequency signal for the filter 402.

The bias tuning mechanism 404 is operable to generate a tuning signal 422 to tune the filter 402. The filter 402 is operable to receive the tuning signal 422 from the bias tuning mechanism 404. The filter 402 is also operable to filter the input signal 420 received from the divider 408 based on the tuning signal 422 to generate a filtered signal 424.

The inverter set 416 is operable to receive the filtered signal 424 from the filter 402 and to generate a delayed filtered signal 425 for the DPFD 410 based on the filtered signal 424. The inverter set 416 may comprise one or more inverters that are each operable to invert an input signal to produce an output signal. Thus, the delayed filtered signal 425 may comprise an inverted or a non-inverted signal with respect to the filtered signal 424 based on whether the number of inverters in the inverter set 416 is odd or even. In generating the delayed filtered signal 425, the inverter set 416 is operable to provide a delay between the filter 402 and the DPFD 410 such that the delayed filtered signal 425 and a shifted signal 426 generated by the divider 408 arrive at the DPFD 410 at essentially the same time at the desired Q value of the filter 402.

The divider 408 is operable to generate the shifted signal 426 with respect to the input signal 420 by delaying that signal for a specified number of clock cycles. For example, for a phase shift of 45°, the divider 408 is operable to delay the signal by one clock cycle in order to generate the shifted signal 426.

The DPFD 410 is operable to receive the delayed filtered signal 425 and the shifted signal 426, to compare the phases of the two signals 425 and 426, and to generate either an up signal 428a or a down signal 428b based on the difference between the phases of the two signals 425 and 426. Because any delay in the system effectively results in a phase change for delayed signals, the delays through the filter 402 and inverter 416 and through the divider 408 are designed to be either equal or multiples of $2\pi$ in order to prevent any offset error in Q.

The up/down counter 412 is operable to receive either the up signal 428a or the down signal 428b and to generate an adjustment signal 430 based on which signal 428a or 428b was received. According to one embodiment, the adjustment signal 430 comprises a plurality of bits, each of which is operable to turn on or off a current source in the bias tuning mechanism 404. The number of bits may comprise five, six or any other suitable number.

The bandgap reference 414 is operable to generate a bandgap reference signal 432 for the bias tuning mechanism 404. The bias tuning mechanism 404 is operable to receive the adjustment signal 430 from the up/down counter 412 and the bandgap reference signal 432 from the bandgap reference 414. The bias tuning mechanism 404 is also operable to generate the tuning signal 422 based on the adjustment signal 430 and the bandgap reference signal 432.

For example, for the embodiment in which the adjustment signal 430 comprises a plurality of bits, the bias tuning mechanism 404 comprises a plurality of corresponding current sources. Each bit of the adjustment signal 430 is operable to turn on or off the corresponding current source. The bias tuning mechanism 404 is then operable to sum the currents produced by the current sources that are turned on in order to generate the tuning signal 422. Thus, the bias tuning mechanism 404 is operable to tune the filter 402 by adjusting the tuning signal 422 in response to any difference between the phase of the delayed filtered signal 425 and the phase of the shifted signal 426, as indicated by the adjustment signal 430. When there is no longer any difference between the phases of the two signals 425 and 426, the filter 402 is tuned.

For one embodiment, as an example, the filter 402 may comprise a biquad filter, which should provide a 45° phase shift at its 3 dB frequencies. In this example, the filter 402 may be assumed to be tuned to its center frequency. For tuning, the signal source 406 may generate the reference signal 418 by generating a signal with a frequency of eight times one of the filter's 3 dB frequencies. The divider 408 may divide the reference signal 418 by eight to generate the input signal 420 and may delay the divided signal by one clock cycle, which corresponds to 45°, to generate the shifted signal 426. The tuning signal 422 is then adjusted by the bias tuning mechanism 404 until the filter 402 and the inverter 416 generate the delayed filtered signal 425 with a 45° phase shift with respect to the input signal 420. However, it will be understood that the signal source 406 may provide any suitable reference signal 418 such that the divider may divide the reference signal 418 by a fixed value in order to generate the input signal 420, which may comprise any suitable, known reference frequency that has a corresponding known phase shift without departing from the scope of the present invention.

Although the present invention has been described with several embodiments, various changes and modifications may be suggested to one skilled in the art. It is intended that the present invention encompass such changes and modifications as fall within the scope of the appended claims.

What is claimed is:

1. A method comprising:
    filtering an input signal using a filter to generate a filtered signal, the filtered signal having a first phase shift with respect to the input signal;
    determining a difference between the first phase shift and a second phase shift; and
    tuning the filter based on the determined difference.

2. The method of claim 1, wherein determining the difference comprises:
    shifting a phase of the input signal by the second phase shift to generate a shifted signal; and
    mixing the shifted signal with the filtered signal.

3. The method of claim 1, wherein tuning the filter comprises:
    generating a tuning signal for the filter based on an error signal, the error signal based on the difference between the first phase shift and the second phase shift; and
    tuning the filter based on the tuning signal.

4. The method of claim 3, wherein:
    tuning the filter further comprises filtering the error signal; and
    the tuning signal for the filter is based on the filtered error signal.

5. The method of claim 1, further comprising:
    generating a reference signal; and
    dividing the reference signal to generate the input signal.

6. The method of claim 1, wherein determining the difference comprises:
    delaying the input signal by a specified number of clock cycles to generate a shifted signal; and
    comparing phases of the shifted signal and the filtered signal.

7. The method of claim 6, wherein:
    determining the difference further comprises delaying the filtered signal to generate a delayed filtered signal; and
    comparing the phases of the shifted signal and the filtered signal comprises comparing phases of the shifted signal and the delayed filtered signal.

8. The method of claim 1, wherein tuning the filter comprises:
    generating an adjustment signal based on an up signal or a down signal, the up signal or the down signal based on the difference between the first phase shift and the second phase shift;
    generating a tuning signal based on the adjustment signal; and
    tuning the filter based on the tuning signal.

9. The method of claim 8, further comprising:
    receiving a bandgap reference signal, wherein generating the tuning signal comprises generating the tuning signal based on the adjustment signal and the bandgap reference signal.

10. A system comprising:
    a filter operable to receive an input signal and to generate a filtered signal;
    a phase shifter operable to generate a shifted signal based on the input signal;
    a mixer/phase frequency detector operable to generate an error signal based on a phase difference between the filtered signal and the shifted signal; and
    a tuner operable to generate a tuning signal for the filter based on the error signal, the filter operable to be tuned based on the tuning signal.

11. The system of claim 10, further comprising:
    a signal source operable to generate the input signal.

12. The system of claim 10, further comprising:
    a second filter operable to filter the error signal and to generate a filtered error signal, the tuner operable to generate the tuning signal based on the filtered error signal.

13. The system of claim 10, wherein the phase shifter is operable to generate the shifted signal by shifting a phase of the input signal.

14. The system of claim 10, wherein the mixer/phase frequency detector is operable to generate the error signal by determining a difference between a phase of the filtered signal and a phase of the shifted signal and generating the error signal based on the difference.

15. A system comprising:
    a filter operable to generate a filtered signal based on an input signal;
    a digital phase frequency detector operable to generate an up signal or a down signal based on a phase difference between the filtered signal and a shifted signal;
    an up/down counter operable to generate an adjustment signal based on the up signal or the down signal; and
    a tuner operable to generate a tuning signal for the filter based on the adjustment signal, the filter operable to be tuned based on the tuning signal.

16. The system of claim 15, further comprising:
    a divider operable to generate the input signal and the shifted signal, the shifted signal based on the input signal.

17. The system of claim 16, wherein the divider is operable to generate the shifted signal by delaying the input signal by a specified number of clock cycles.

18. The system of claim 16, further comprising:
    a signal source operable to generate a fixed multiple of the input signal for the divider.

19. The system of claim 15, further comprising:
at least one inverter operable to delay the filtered signal and to generate a delayed filtered signal, wherein the digital phase frequency detector is operable to generate the up signal or the down signal based on a phase difference between the delayed filtered signal and the shifted signal.

20. A device comprising:
at least one of: transmit circuitry operable to generate an outgoing signal for transmission and receive circuitry operable to process a received incoming signal, wherein at least one of the transmit circuitry and the receive circuitry comprises a filter operable to:
filter an input signal to generate a filtered signal, the filtered signal having a first phase shift with respect to the input signal;
determine a difference between the first phase shift and a second phase shift; and
tune itself based on the determined difference.

\* \* \* \* \*